US012577098B2

(12) United States Patent
Schelling et al.

(10) Patent No.: US 12,577,098 B2
(45) Date of Patent: Mar. 17, 2026

(54) MEMS DEVICE FOR INTERACTION WITH FLUIDS

(71) Applicant: Robert Bosch GmbH, Stuttgart (DE)

(72) Inventors: Christoph Schelling, Stuttgart (DE); Timothy Schultz, Camino, CA (US)

(73) Assignee: Robert Bosch GmbH, Stuttgart (DE)

( * ) Notice: Subject to any disclaimer, the term of this patent is extended or adjusted under 35 U.S.C. 154(b) by 794 days.

(21) Appl. No.: 18/055,140

(22) Filed: Nov. 14, 2022

(65) Prior Publication Data

US 2024/0158221 A1 May 16, 2024

(51) Int. Cl.
B81B 3/00 (2006.01)

(52) U.S. Cl.
CPC .... B81B 3/0021 (2013.01); B81B 2201/0257 (2013.01); B81B 2201/036 (2013.01); B81B 2203/0118 (2013.01); B81B 2203/053 (2013.01)

(58) Field of Classification Search
CPC .......... B81B 3/0021; B81B 2201/0257; B81B 2201/036; B81B 2203/0118; B81B 2203/053
See application file for complete search history.

(56) References Cited

U.S. PATENT DOCUMENTS

| | | | |
|---|---|---|---|
| 10,457,544 B2 | 10/2019 | Schenk et al. | |
| 10,609,474 B2 | 3/2020 | Liang et al. | |
| 11,743,634 B2 * | 8/2023 | Boyd | H04R 1/283 |
| | | | 181/157 |
| 11,905,164 B2 * | 2/2024 | Ho | H04R 1/245 |
| 2009/0322260 A1 * | 12/2009 | Lee | G01C 19/5719 |
| | | | 318/116 |
| 2022/0002143 A1 | 1/2022 | Langa et al. | |

* cited by examiner

*Primary Examiner* — Emily P Pham
(74) *Attorney, Agent, or Firm* — Kelly McGlashen; Maginot, Moore & Beck LLP

(57) ABSTRACT

A fluidic microelectromechanical system (MEMS) device includes fluid interaction elements (FIEs) that can be displaced by an actuator to generate fluid flow. The FIEs include a serial arrangement of cantilevered lever arms to achieve, for example, high sound pressure levels in a micro speaker or high pump rates in a micropump as compared to some conventional MEMS devices.

19 Claims, 13 Drawing Sheets

MEMS DEVICE FOR INTERACTION WITH FLUIDS

BACKGROUND

Actuated and sensing microelectromechanical system (MEMS) devices for interaction with fluids have been conceived for a variety of purposes, such as microphones, micropumps, microspeakers, mass flow sensors, etc. For example, in some actuated MEMS devices that function as a microspeaker, the devices include a membrane that is actively deflected, and the movement of the membrane is transmitted in the form of sound into the surrounding fluid.

Actuated MEMS devices are limited in their fluid throughput performance by their comparatively small strokes. In an actuated MEMS device that functions as a microspeaker, the ability of the microspeaker to generate high sound pressure levels scales in proportion to the fluid volume displaced by the microspeaker.

Although fluid volume displacement is traditionally realized by moving membranes with large strokes, in MEMS technology, it is difficult to achieve reliable devices capable of large strokes. In addition, scaling the membrane size in a MEMS device will directly translate into chip size and cost. Increasing device size to achieve greater volumes of fluid displacement is counter to the desirability for reduced device size in applications such as micro speakers used in in-ear applications. Other conventional MEMS speakers may be difficult to fabricate due to the narrow-defined gaps required for capacitive actuation.

MEMS solutions having increased fluid throughput performance while allowing for a small speaker volume compared to state-of-the-art electrodynamic speakers are advantageous. Thus, it is desirable to have a fluidic MEMS device that can displace large volumes of a fluid in a single stroke thereby generating high volume throughput while also being easy to manufacture.

SUMMARY

Fluidic MEMS devices are described herein that are configured to interact with a volume flow of fluid. The MEMS devices described herein can displace large volumes of a fluid in a single stroke generating high volume throughput and can be manufactured using current MEMS manufacturing technology. The MEMS devices described herein can displace a significant air volume by using fluid interaction elements (FIE) disposed in an interior cavity of the device. The FIEs employ a serial arrangement of cantilevered lever arms to achieve high sound pressure levels in a micro speaker or high pump rates in a micropump.

As used herein, the term "cantilever" refers to a beam having a first end, a second end that is opposite the first end and spaced apart from the first end, and a body that extends between the first and second ends, where the body and the second end are unsupported, and the first end is fixed to a support surface.

Cantilevers are intrinsically advantageous with respect to large strokes, since there are comparatively few constraints that limit their bending/stroke range. Placed inside a fluidic channel, a cantilever can interact with that fluid in many ways. For example, a fluid flow through the channel can deflect the cantilever. Conversely, actuated cantilevers can displace fluid volume and thus generate sound pressure waves. Implementation of out-of-plane actuation means is easy in mostly planar semiconductor technology, whereas in-plane actuation is more difficult. However, a horizontal arrangement of cantilevers requires large areas and out-of-plane movement does not enable fluidic squeeze-out between cantilevers in countermovement.

The references to "plane," "planar," "horizontal" or "vertical" are used with reference to fabrication of MEMS, which evolved from the process technology in semiconductor device fabrication. In such fabrication, for example, the basic techniques are deposition of material layers on a substrate or wafer, patterning by photolithography and etching to produce the required shapes. Thus, as used herein, the terms "plane" and "horizontal" refer to the plane defined by the substrate that forms the MEMS device. In this disclosure, the substrate is a composite of several layers of material (e.g., wafers) so that the term "in-plane" may refer to a plane that is parallel to each of the layers and is generally located at a mid-thickness of the substrate.

Therefore, a cantilever with out-of-plane actuation and fluidic squeeze at the same time is described here and is realized by a FIE that is disposed in an interior cavity of the MEMS device substrate. The FIE includes two orthogonal and serially connected cantilevered lever arms. For example, the FIE may include a first lever arm (e.g., a first cantilever element) that is fixed at one end to an inner surface of the MEMS device substrate and a second lever arm (e.g., a second cantilever element) that is fixed to, and supported by only, the first cantilever element. In order to achieve fluid displacement, an actuator may be configured to apply an actuation force to the first cantilever element, whereby the first cantilever element is bent relative to the MEMS device substrate, which in turn results in a waving motion of the second cantilever element. Thus, the FIE may use actuators such as piezo actuators or nanoelectric drive actuators to achieve out-of-plane actuation by bending. Alternatively, in order to achieve sensing of mass flow, a strain detector may be applied to the first cantilever element, whereby motion of the second cantilever element due to fluid flow can be sensed by the detector which can generate a corresponding electrical signal. In some embodiments, the sensing means is configured to sense a change of the ratio of input and output space volume.

The MEMS devices described herein are free of membranes. This can be compared to some conventional MEMS speakers, in which the lateral movement of vertical structures that are interconnected via a folded membrane is used to generate large volume displacements in a small die area. However, in such conventional MEMS speakers, air expulsion may induce a recoil countermovement of the folded membrane thus adversely affecting the generated overall sound pressure level.

Advantageously, the actuated MEMS devices described herein are capable of displacing a significant air volume by using lever arms achieving high sound pressure levels in a microspeaker or high pump rates in a micropump. The sensing MEMS devices described herein are capable of increased sensitivity to fluid flow relative to some conventional sensing MEMS devices.

In some aspects, a micro electromechanical system (MEMS) device includes a substrate, the substrate including a first layer including a first fluid port, a second layer including a second fluid port, and an intermediate layer that is disposed between the first layer and the second layer in a stacked arrangement. The intermediate layer includes a central opening. The central opening is in communication with the first fluid port and the second fluid port. The MEMS device includes a support rail that protrudes from an inner surface of the substrate so as to extend into the central opening. The support rail has a support surface. The MEMS device includes a fluid interaction element (FIE) that is disposed in the central opening. The FIE includes first and second cantilever elements. The first cantilever element protrudes from the support surface. The first cantilever element has a first cantilever first end that is fixed to the support surface and a first cantilever second end that is opposite the first cantilever first end and is unsupported. The second cantilever element has a second cantilever first end that is fixed to the first cantilever second end and a second cantilever second end that is opposite the second cantilever first end. The second cantilever second end is unsupported. In addition, the MEMS device includes an electronics component that is connected to the FIE.

In some embodiments, the electronic component is an actuator that is configured to actuate FIE to move relative to the support rail.

In some embodiments, the actuator is connected to the first cantilever element and is configured to actuate the first cantilever element to move relative to the support rail.

In some embodiments, the support surface is perpendicular to the first layer.

In some embodiments, the support rail protrudes from the first layer so as to extend into the central opening.

In some embodiments, the support rail protrudes from the intermediate layer so as to extend into the central opening.

In some embodiments, the first layer, the second layer and the intermediate layer each have a length, a width, and a thickness. The support rail defines a rail axis that extends in a direction parallel to the width, and actuation of the actuator causes the first cantilever element to bend about an axis that is parallel to the rail axis.

In some embodiments, the substrate includes a partition that extends in parallel to the first and second layers. The partition segregates the central opening into a first chamber and a second chamber. The partition includes a partition fluid port that permits fluid communication between the first chamber and the second chamber. The support rail comprises a first support rail that is disposed in the first chamber and a second support rail that is disposed in the second chamber, and the FIE comprises a first FIE that is disposed in the first chamber and is supported on the first support rail and a second FIE that is disposed in the second chamber and is supported on the second support rail.

In some embodiments, the substrate includes a partition that extends in parallel to the first and second layers. The partition segregates the central opening into a first chamber and a second chamber. The partition includes a partition first fluid port and a partition second fluid port, the partition first port and the partition second fluid port permitting fluid communication between the first chamber and the second chamber. The support rail comprises a first support rail and a second support rail that are disposed in the first chamber, and a third support rail and a fourth support rail that are disposed in the second chamber. In addition, the FIE comprises a first FIE and a second FIE that are disposed in the first chamber, and third FIE and a fourth FIE that are disposed in the second chamber. The first FIE is supported on the first support rail, the second FIE is supported on the second support rail, the third FIE is supported in the third support rail, and the fourth FIE is supported on the fourth support rail.

In some embodiments, the first support rail and the third support rail are aligned with the partition first fluid port along a first axis that is perpendicular to the first layer. In addition, the second support rail and the fourth support rail are aligned with the partition second fluid port along a second axis that is perpendicular to the first layer.

In some embodiments, the partition includes a partition third fluid port and a partition fourth fluid port, the third and fourth fluid ports permitting fluid communication between the first chamber and the second chamber. The partition first fluid port, the partition second fluid port, the partition third fluid port and the partition fourth fluid port are arranged sequentially along a first axis that is parallel to the first layer. The first support rail is aligned with the partition first fluid port along a second axis that is perpendicular to the first layer. The third support rail is aligned with the partition second fluid port along a third axis that is perpendicular to the first layer. The second support rail is aligned with the partition third fluid port along a fourth axis that is perpendicular to the first layer, and the fourth support rail is aligned with the partition fourth fluid port along a fifth axis that is perpendicular to the first layer.

In some embodiments, actuation of the actuator results in movement of the first cantilever element and the second cantilever element within a plane, and an actuation force applied by the actuator acts in a direction perpendicular to the plane.

In some embodiments, when the FIE is unloaded, the second cantilever element extends in a direction that is substantially perpendicular to the first cantilever element.

In some embodiments, the first layer, the second layer and the intermediate layer each have a length, a width, and a thickness. The first fluid port extends in a thickness direction of the first layer, and the second fluid port extends in a thickness direction of the second layer.

In some embodiments, the FIE includes a third cantilever element having a third cantilever first end that is fixed to the first cantilever second end and a third cantilever second end that is opposite the third cantilever first end. The third cantilever second end is unsupported. In addition, the second cantilever first end and the third cantilever element first end are joined to each other such that the second cantilever first end, the second cantilever second end, the third cantilever first end and the third cantilever second end are aligned along a common axis.

In some aspects, a FIE of a MEMS device is provided. The MEMS device includes a substrate that has an internal cavity that receives the FIE. The FIE includes a first cantilever element that is configured to be cantilevered from an internal surface of the substrate. The first cantilever element has a first cantilever first end and a first cantilever second end that is opposite the first cantilever first end. The first cantilever second end is unsupported. In addition, the FIE includes a second cantilever element having a second cantilever first end and a second cantilever second end that is opposite the second cantilever first end. The second cantilever first end is fixed to the first cantilever at a location that is spaced apart from the first cantilever first end, and the second cantilever second end is unsupported.

In some embodiments, the FIE includes a strain detector that is connected to the first cantilever element and is configured to detect a strain in the first cantilever element.

In some embodiments, the FIE includes an actuator that is connected to the first cantilever element and is configured to drive the first cantilever element to move relative to the substrate.

In some embodiments, the actuator is a piezo actuator.

In some embodiments, the actuator is a nanoelectric drive actuator.

In some embodiments, actuation of the actuator results in movement of the first cantilever element and the second cantilever element within a plane, and an actuation force applied by the actuator acts in a direction perpendicular to the plane.

DETAILED DESCRIPTION

Figure 1:
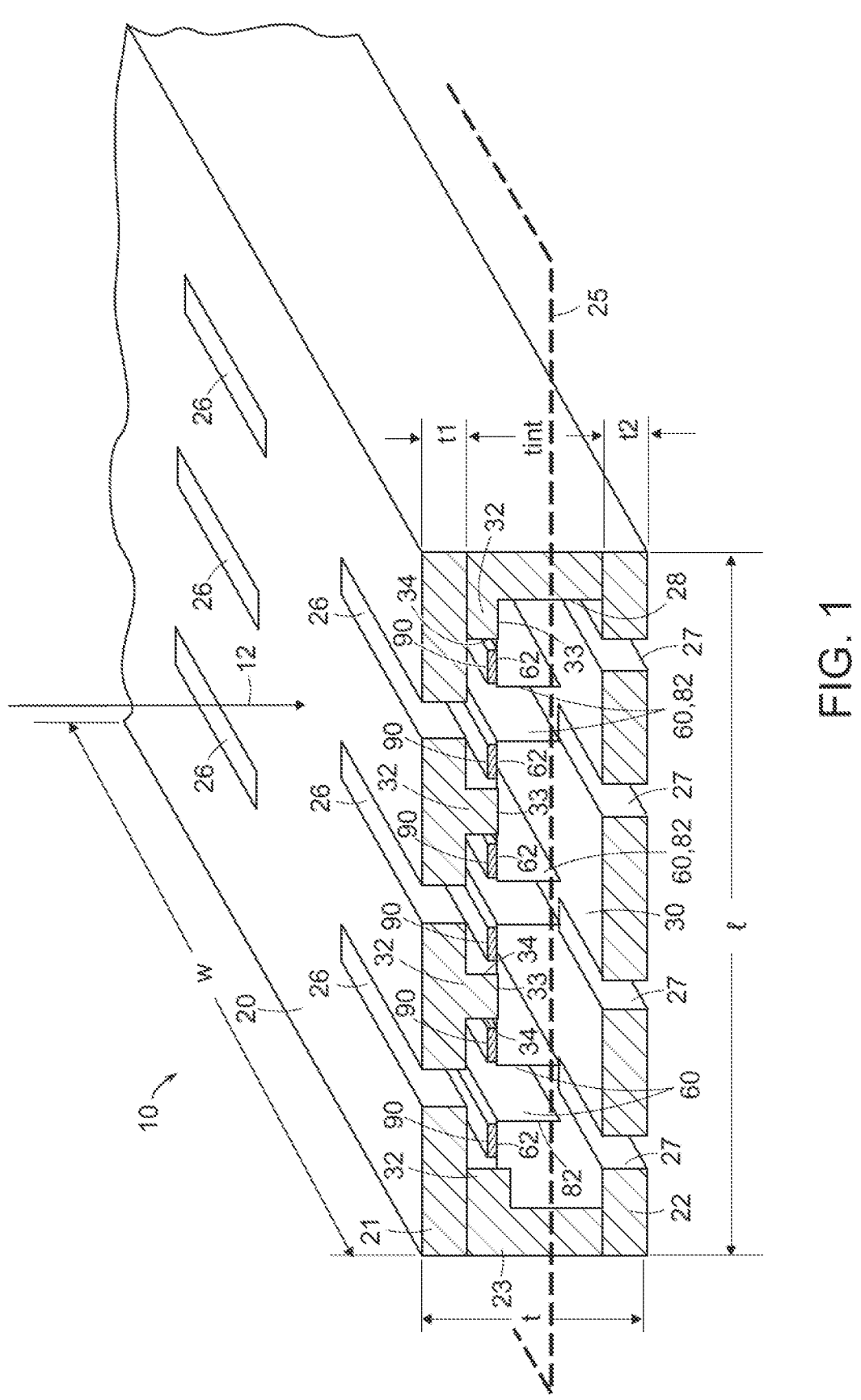
FIG. 1 is a perspective view of a portion of an actuated MEMS device shown in perspective side cross-section.

Referring to FIG. 1, a MEMS device 10 is configured to interact with a volume flow 12 of a fluid. The fluid may be a gas (such as air) and/or a liquid. The MEMS device 10 includes a substrate 20 having an interior cavity 30 and cantilevered fluid interaction elements (FIEs) 60 that are disposed in the interior cavity 30. The FIEs may be connected to the substrate 20 via support rails 32 that extend through the interior cavity 30. The FIEs 60 protrude from the support rails 32 and include a serial arrangement of cantilevered lever arms 62, 82. In some applications, the MEMS device 10 is an actuated device. In an actuated device, the MEMS device 10 includes actuators 90 that are configured to apply an actuation force to the respective FIEs 60. The FIEs 60 are configured to displace large volumes of a fluid in a single stroke to generate a high volume of fluid flow through the substrate 20. In other applications, the MEMS device 10 is a sensing device. In a sensing device, the MEMS device 10 includes sensors 92 that are configured to detect motion of the FIEs 60 whereby the FIEs 60 are configured to permit detection of fluid flow rates through the MEMS device 10. For purposes of description, exemplary embodiments of an actuated MEMS device 10, for example a microspeaker, will now be described in detail. Although the MEMS device 10 is described herein as being a microspeaker, the MEMS device 10 is not limited to this application. For example, the MEMS device 10 described herein may advantageously be used in a multitude of applications, including, but not limited to, micro pumps, microphones, mass flow sensors, etcetera.

The substrate 20 is a support structure or housing having a stacked arrangement of multiple material layers or wafers, within which the elements of the MEMS device are fabricated or attached. In the illustrated embodiment, the substrate 20 includes at least three material layers 21, 22, 23 which may be bonded, connected by adhesives, or connected by intermediate spacer layers. The first layer 21, also referred to as a cap layer, is an outer layer that includes a plurality of first fluid ports 26. The second layer 22, also referred to as a socket layer, is an outer layer on a side of the substrate 20 opposite the first layer 21. The second layer 22 includes a plurality of second fluid ports 27. The intermediate layer 23 is disposed between the first layer 21 and the second layer 22 in a stacked arrangement. The intermediate layer 23 includes a central opening 28 that is in communication with the first fluid ports 26 and the second fluid ports 27. In the illustrated embodiment, the inner surface of the first layer 21, the inner surface of the second layer 22 and the central opening 28 together define the interior cavity 30 of the MEMS device 10.

The first layer 21, the second layer 22 and the intermediate layer 23 each have a length, a width, and a thickness, and have a plate configuration in that the length and width dimensions are much greater than the thickness dimensions. For example, in some embodiments, in each of the first layer 21, the second layer 22 and the intermediate layer 23, the length and width of the respective layer is at least twice the thickness of the respective layer. In other embodiments, in each of the first layer 21, the second layer 22 and the intermediate layer 23, the length and width of the respective layer may be at least three times the thickness of the respective layer. In still other embodiments, in each of the first layer 21, the second layer 22 and the intermediate layer 23, the length and width of the respective layer may be at least ten times the thickness of the respective layer.

The first layer 21, the second layer 22 and the intermediate layer 23 have the same length and width dimensions but may have different thickness dimensions. In the illustrated embodiment, the thickness dimension $t_{int}$ of the intermediate layer 23 is greater than that $t_1$, $t_2$ of the first and second layers 21, 22. For example, in some embodiments, the thickness dimension to of the intermediate layer 23 is twice the thickness dimension $t_1$, $t_2$ of the first or second layer 21, 22. In other embodiments, the thickness dimension taw of the intermediate layer 23 is four times the thickness dimension $t_1$, $t_2$ of the first or second layer 21, 22 or more.

Although the substrate 20 is an arrangement of multiple stacked layers, the overall thickness of the substrate 20 is very small. For example, in some exemplary and non-limiting embodiments, the overall thickness of the substrate 20 is in a range of 400 to 1200 microns. Moreover, for purposes of this description, the substrate 20 is considered to define a substrate plane 25 that includes the length and width dimensions of the substrate 20 and passes through a midthickness of the intermediate layer 23.

The first fluid ports 26, the second fluid ports 27 and the central opening 28 are each continuous through openings in that they extend through the thickness of the respective layers 21, 22, 23. The central opening 28 is large relative to the size of the first and second fluid ports 26, 27, and each first and second fluid port 26, 27 is in fluid communication with the central opening 28.

The first fluid ports 26 and the second fluid ports 27 are openings in the substrate 20 through which the volume flow 12 may pass from a surrounding area of the MEMS device 10 (e.g., the environment of the MEMS device 10) into the interior cavity 30 and/or out of the interior cavity 30 into a surrounding area of the MEMS device 10. The direction of volume flow 12 through the MEMS device 10 is generally perpendicular to the plane 25 defined by the substrate 20 and thus parallel to a stacking direction of the first, second and intermediate layers 21, 22, 23.

In addition to the first layer 21, the second layer 22 and the intermediate layer 23, the substrate 20 may include support rails 32 that extend through the interior cavity 30. In the embodiment shown in FIG. 1, the support rails 32 protrude inward from an inner surface of the first layer 21. Each support rail 32 may have a rectangular cross section, although the support rails 32 are not limited to this cross-sectional shape. In the illustrated embodiment, each support rail 32 includes an end surface 33 that faces the second layer 22 and at least one support surface 34. Each support surface 34 lies in a plane that is perpendicular to the substrate plane 25 and parallel to the width direction of the substrate 20 and each support surface 34 faces an opposed inner surface of the intermediate layer 23.

The support rails 32 are spaced apart along the length direction of the substrate 20 and extend linearly in the width direction of the substrate 20. A first fluid port 26 is disposed between each pair of adjacent support rails 32. In addition, each support rail 32 is aligned with a second fluid port 27 in a direction perpendicular to the substrate plane 25.

The substrate 20, including the first layer 21, the second layer 22, the intermediate layer 23 and the support rails 32, may comprise any material. For example, the substrate 20 may include a metal material, a plastic material, a resin material, a semiconductor material such as a silicon material and/or other material that is appropriate for the specific application.

Figure 2:
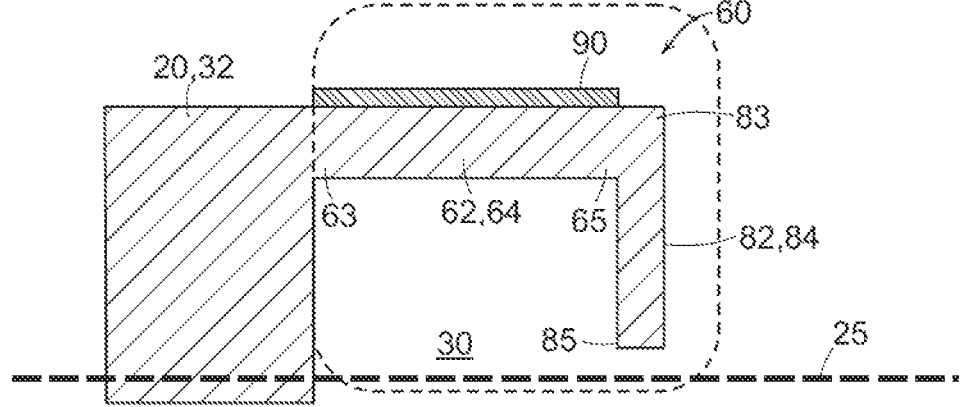
FIG. 2 is a side cross-sectional view of a portion of the MEMS device of FIG. 1 illustrating a single fluid interaction element.

Referring also to FIG. 2, the MEMS device 10 includes FIEs 60 that are disposed in the interior cavity 30. As seen in FIG. 2, which is a schematic illustration of portion of the substrate 20 showing a single FIE 60 in a static state, each FIE 60 is cantilevered from a surface of the substrate 20. In particular, each FIE 60 is cantilevered from a surface of the substrate 20 that lies in a plane perpendicular to the substrate plane 25, which may be, but is not limited to, a support surface 34 of a support rail 32. Each FIE 60 includes a first lever arm, also referred to as a first cantilever element 62 and a second lever arm, also referred to as a second cantilever element 82. The first and second cantilever elements 62, 82 are serially connected and each has a cantilever configuration.

The first cantilever element 62 is a beam that protrudes from a corresponding support surface 34 and includes a first cantilever first end 63 that is fixed to the support surface 34 and a first cantilever second end 65 that is opposite the first cantilever first end 63. The first cantilever element 62 includes a first cantilever body 64 that extends between the first cantilever first and second ends 63, 65. The first cantilever body 64 and second end 65 are unsupported. When the FIE 60 is not actuated and/or is in an unloaded state, the first cantilever body 64 is parallel to, or substantially parallel to, the substrate plane 25. As used herein, the term "substantially parallel" refers to being within a range of plus or minus five degrees of parallel, and the term "substantially perpendicular" refers to being within a range of plus or minus five degrees of perpendicular.

The second cantilever element 82 is a beam that protrudes from the second end 65 of the first cantilever element 62. The second cantilever element 82 includes a second cantilever first end 83 that is fixed to the second end 65 of the first cantilever element 62 and a second cantilever second end 85 that is opposite the second cantilever first end 83. The second cantilever element 82 includes a second cantilever body 84 that extends between the second cantilever first and second ends 83, 85. The second cantilever body 84 and second end 85 are unsupported.

The second cantilever first end 83 is fixed to the first cantilever second end 65 in such a way that, when the FIE 60 is not actuated and/or is in an unloaded state, the second cantilever element 82 is perpendicular to, or substantially perpendicular to, the first cantilever element 62. Thus, when the FIE 60 is not actuated and/or is in an unloaded state, the second cantilever body 84 extends perpendicular to, or substantially perpendicular to, the substrate plane 25.

The length of the first cantilever element 62 corresponds to a distance between the first cantilever first end 63 and the first cantilever second end 65. Similarly, the length of the second cantilever element 82 corresponds to a distance between the second cantilever first end 83 and the second cantilever second end 85. Although the first and second cantilever elements 62, 82 may have the same length, they are not limited to having the same length and the relative lengths of the first and second cantilever elements 62, 82 will depend on the requirements of the specific application. In one example, as seen in the embodiment illustrated in FIG. 2, the length of the first cantilever element 62 is approximately the same as the length of the second cantilever element 82. In another example, as seen in the embodiment illustrated in FIG. 4, the length of the first cantilever element 62 is much smaller than the length of the second cantilever element 82. In this example, the length of the first cantilever element 62 is about twenty percent of the length of the second cantilever element 82.

Figure 3:
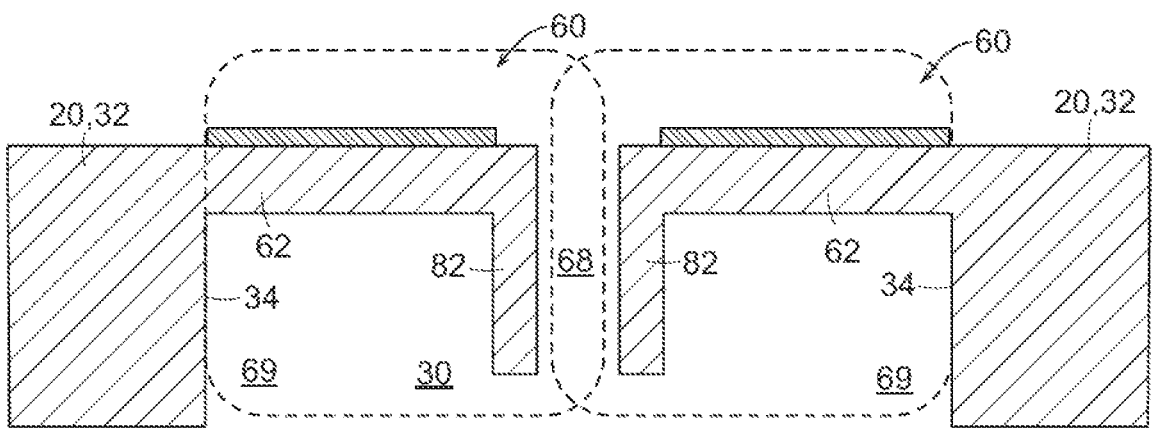
FIG. 3 is a side cross-sectional view of a portion of a MEMS device illustrating a pair of fluid interaction members in a mirrored arrangement.

Referring to FIG. 3, two or more FIEs 60 may be disposed in a common cavity. e.g., the interior cavity 30. In some embodiments, adjacent FIEs 60 may have a mirrored arrangement in which adjacent pairs of first cantilever elements 62 protrude toward each other and are generally coplanar. In addition, within each adjacent pair, the respective second cantilever elements 82 are disposed side-by-side with a gap therebetween that corresponds to a shared inlet space 68. In a mirrored arrangement, an output space 69 is defined between each second cantilever element 82 and the portion of the substrate 20 from which it is cantilevered. Inlet and outlet spaces 68, 69 are discussed below. In the mirrored arrangement, the adjacent pair of FIEs 60 may share a common first fluid port 26 and/or a second fluid port 27.

Mirrored FIEs 60 can share a common first fluid port 26 and/or a second fluid port 27 in an area-efficient way and allow fluidic performance efficient countermovement. For example, FIEs 60 in a mirrored arrangement are operated such that the respective first cantilever element 62 and/or second cantilever element 82 always move in opposite directions, resulting in either expansion or contraction of the common inlet space 68/outlet space 69 therebetween. Advantageously, by positioning multiple FIEs 60 in a common cavity, for example in a mirrored arrangement, more FIEs 60 may enable higher ratios of input space volume and output space volume as compared to other embodiments in which each FIE 60 is disposed in a cavity by itself.

Figure 4:
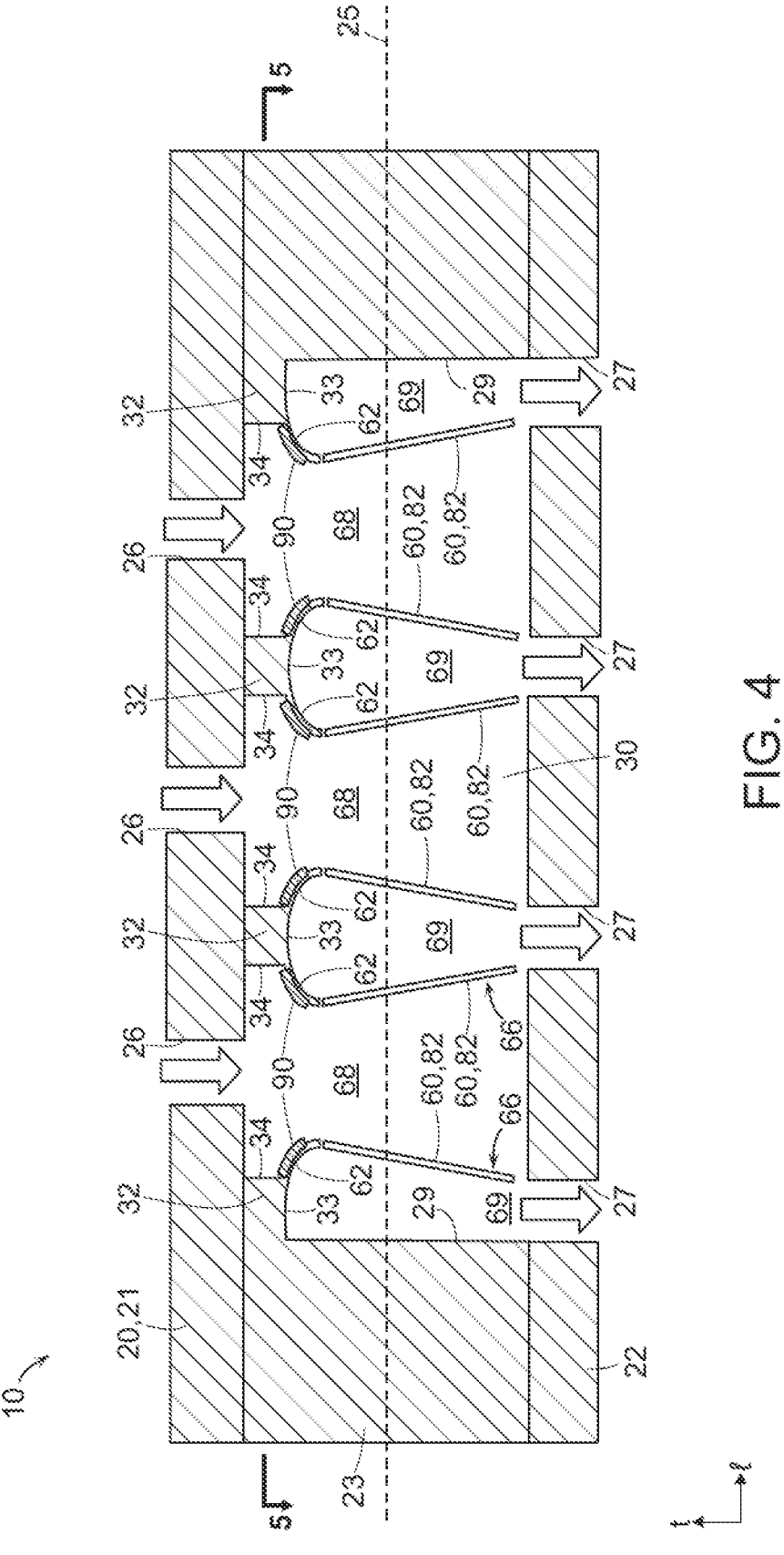
FIG. 4 is a side cross-sectional view of a MEMS device illustrating several fluid interaction elements disposed in the interior cavity of the substrate.
Figure 5:
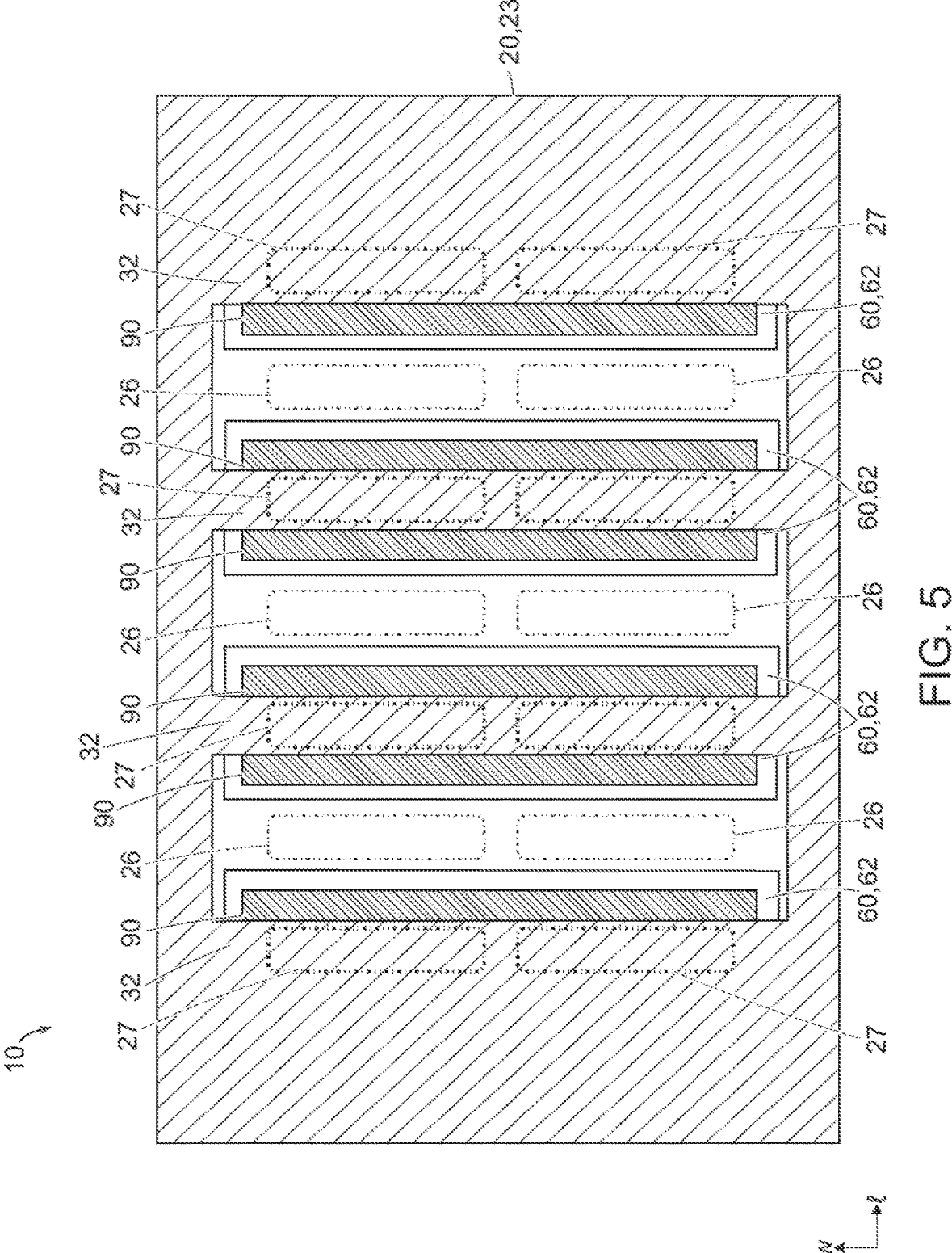
FIG. 5 is a top cross-sectional view of the MEMS device of FIG. 4 as seen along line 5-5 of FIG. 4.

Referring to FIGS. 4 and 5, in an exemplary MEMS device 10, several FIEs 60 are disposed in a common interior cavity 30. In this embodiment, the FIEs 60 have a mirrored arrangement. When unloaded, each support rail 32 and the respective FIE(s) 60 supported thereon extend from the first layer 21 to a location closely spaced relative to the second layer 22 and thus generally extend in a direction perpendicular to the substrate plane 25. As a result, each FIE 60 (e.g., the first cantilever element 62 and the second cantilever element 82) and the corresponding support rail 32 cooperate to serve as a movable partition 66. Thus, the FIEs 60 are configured so that the support rails 32 and the first and second cantilever elements 62, 82 substantially divide the interior cavity 30 into separate spaces that include one or more inlet spaces 68 and one or more outlet spaces 69. In the illustrated embodiment, the inlet space 68 defines an inlet space volume. The inlet space 68 is proximate one or more of the first fluid ports 26 and communicates with at least one of the first fluid ports 26. The outlet space 69 defines an outlet space volume. The outlet space 69 is proximate one or more of the second fluid ports 27 and communicates with at least one of the second fluid ports 27.

The MEMS device 10 includes actuators 90 that are configured to apply an actuation force to the first cantilever element 62 of each respective FIE 60. The actuators 90 may be a piezo actuator or a nanoelectric drive actuator. Each actuator 90 may be applied in a direction perpendicular to the substrate plane 25 (e.g., out-of-plane actuation). In some embodiments, each FIE 60 is actuated individually by a single, dedicated actuator 90, while in other embodiments a single actuator 90 may actuate multiple FIEs 60. In still other embodiments, multiple actuators 90 may be used to actuate different locations of a single FIE 60 (e.g., segmentation). Segmentation and individual addressability of the actuation in the width direction enables better local control and allows for lateral wave-like drive schemes for squeeze-out of fluid to lateral output ports when lateral output ports are provided.

Upon actuation by an actuator 90, the first cantilever element 62 is changed in shape and or dimension. In the illustrated embodiment, the first cantilever element 62 is bent about an axis parallel to the width direction upon actuation but is not limited to this motion. Although the second cantilever element 82 is not deformed by actuation of the actuator 90, the second cantilever element 82 is moved relative to the support rail 32 by virtue of the movement of the first cantilever element 62. In some embodiments, the second cantilever element 82 may be bent by fluidic resistance, depending on the properties of the material used to form the FIE 60. For example, the second cantilever element 82 may move in a waving or wiping motion.

In the embodiment illustrated in FIG. 4, a FIE 60 is supported on each support surface 34 of each of the support rails 32. In addition, the first cantilever element 62 is actuated by the corresponding actuator 90 to bend in a first direction which results in the second end 85 of the second cantilever element 82 being swept toward the second fluid ports 27. In FIG. 4, the first cantilever element 62 is shown in a bent configuration that results from actuation by the actuator 90, whereas the second cantilever element 82, although shown in a straight configuration in this figure, may also be bent to some extent by fluidic resistance. As a result of this motion, the volume of the outlet space 69 is reduced, causing fluid to be discharged from the outlet space 69 via the second fluid ports 27. In addition, the volume of the inlet space 68 is increased. An increase in size of the inlet space 68 may lead to a negative pressure of the fluid in the inlet space 68 so that the volume flow 12 flows into the inlet space 68 via the first fluid ports 26.

Subsequently, the first cantilever element 62 may be actuated by the corresponding actuator 90 to bend in a second direction, where the second direction is opposite the first direction. Bending of the first cantilever element in the second direction results in the second end 85 of the second cantilever element 82 being swept away from the second fluid ports 27. As a result of this motion, the volume of the outlet space 69 is increased, causing fluid to be drawn into the outlet space 69 via the second fluid ports 27. In addition, the volume of the inlet space 68 is decreased, causing fluid to be discharged out of the inlet space 68 via the first fluid ports 26.

The actuators 90 may be controlled by a controller (not shown) to control the actuation direction, force, speed, duration, and frequency as determined by the requirements of the specific application. In this way, the actuators 90 are configured to change the ratio of input and output space volume. Fluid volume may be drawn into the input space 68 and, at the same time, is ejected from the output space 69. This arrangement with an open back volume avoids actuation against a stiff fluid spring (closed back volume).

The interior cavity 30 is essentially separated into inlet spaces 68 and outlet spaces 69 by the FIEs 60. The inlet spaces 68 are disposed near, and have fluid communication with, the first fluid port(s) 26 and the outlet spaces 69 are disposed near and have fluid communication with the second fluid port(s) 27. The tighter the clearance of the FIE 60 at the interface of inlet space 68 and outlet space 69 with the inner surface of the substrate 20, the less fluid leaks around the FIE 60 and the more efficiently the fluid is moved. In some embodiments, the clearance in the length direction between the second cantilever element 82 and the adjacent lateral or side surface 29 of the substrate 20 (e.g., the surface perpendicular to the substrate plane 25) can be in a range of about one time (i. e., the spacing relative to a substrate side surface 29) to two times (i. e., the spacing relative to an adjacent mirrored second cantilever element 82) the length of the first cantilever element 62. Thus, the second cantilever element 82 is able to oscillate and/or move symmetrically with symmetrical amplitude limitations. The clearance of the first and second cantilevers in width and thickness direction is preferably as small as possible to prevent fluid leakage between inlet 68 and output 69 spaces.

Referring to FIG. 5, when the MEMS device 10 of FIG. 4 is seen in a section taken along line 5-5 of FIG. 4, it can be seen that each FIE 60 extends in the width direction between opposed interior surfaces of the internal vacancy 30. In addition, a single actuator 90 is associated with each FIE 60 and has a dimension in the width direction that is equal to or slightly less than (slightly less than is shown in FIG. 5) that of the FIE 60. In this view, the first fluid ports 26 and the second fluid ports 27 are not seen but are represented by broken lines to illustrate their positions relative to the support rails 32 and FIEs 60. In particular, the second fluid ports 27 are aligned with the support rails 32 in a direction perpendicular to the substrate plane 25. In addition, the first fluid ports 26 are disposed between adjacent pairs of support rails 32.

Figure 6:
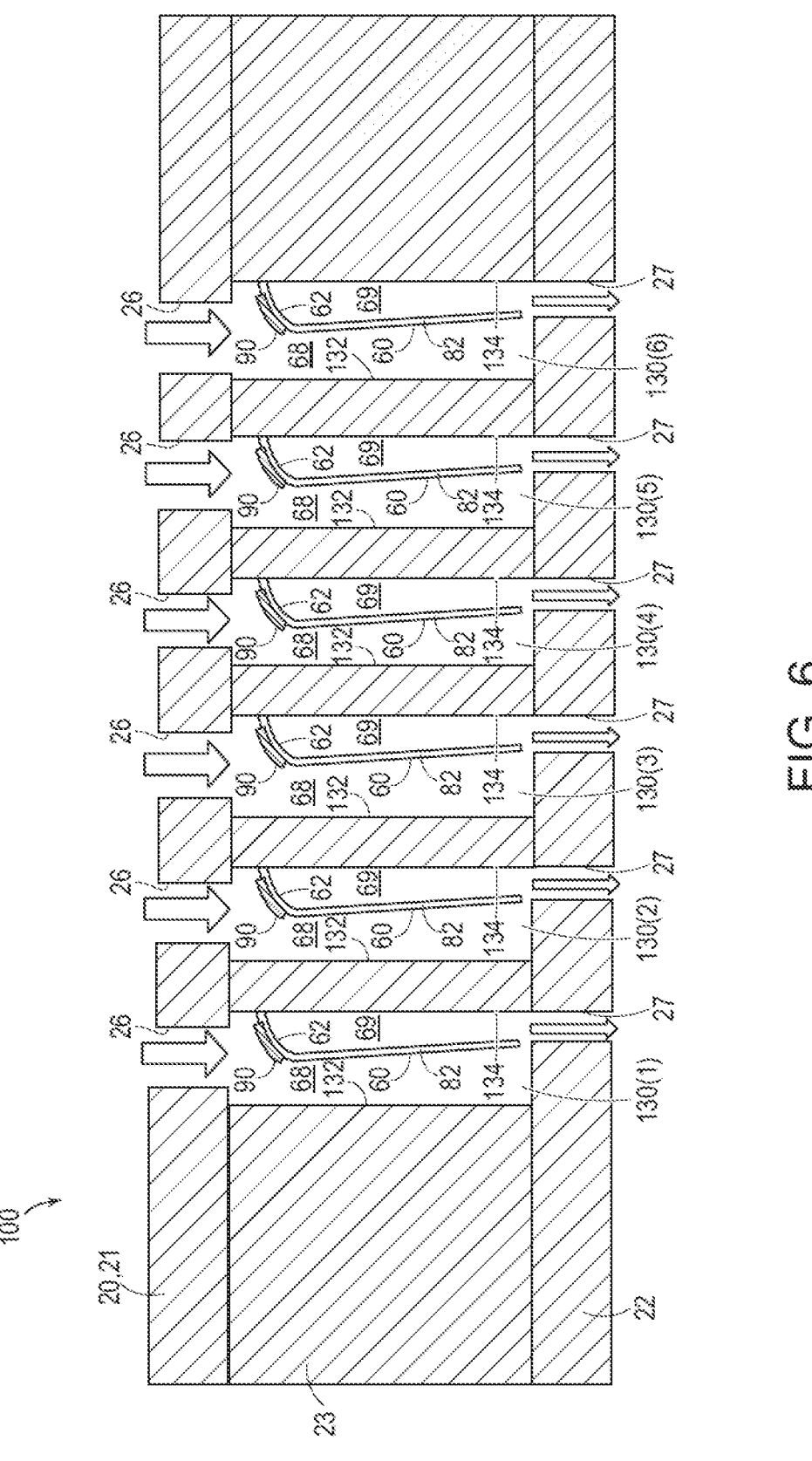
FIG. 6 is a side cross-sectional view of an alternative embodiment MEMS device.

Referring to FIG. 6, an alternative embodiment MEMS device 100 is similar to the MEMS device 10 described above with respect to FIGS. 4 and 5, and common reference numbers are used to refer to common elements. The MEMS device 100 of FIG. 6 differs from the previous embodiment in that each FIE 60 is disposed within its own cavity. To this end, the interior cavity 30 of substrate 120 is segregated into smaller cavities 130(1), 130(2), 130(3), 130(4), 130(5), 130(6) by partitions 132. The partitions 132 replace the support members 32 and extend between respective inner surfaces of the first and second layers 21, 22. Each partition provides support surfaces 134 on which a respective FIE 60 may be supported. Each support surface 134 lies in a plane that is perpendicular to the substrate plane 25 and parallel to the width direction of the substrate 120 and each support surface 134 faces an opposed inner surface of the intermediate layer 23. Each individual cavity 130(1), 130(2), 130 (3), 130(4), 130(5), 130(6) has at least one dedicated first fluid port 26 and at least one dedicated second fluid port 27. In cavities that adjoin the intermediate layer 23, for example the sixth cavity 130(6), the FIE 60 may be supported on the inner surface of the intermediate layer 23.

In MEMS device 100, the partitions 132 and the inner surfaces of the intermediate layer 23 each provide a fixed wall against which the fluid wave generated by the respective FIE 60 acts. In addition, the respect inlet spaces 68 and outlet spaces 69 each have a relatively small volume as compared to an arrangement that is free of partitions, such as illustrated in FIG. 4.

Figure 7:
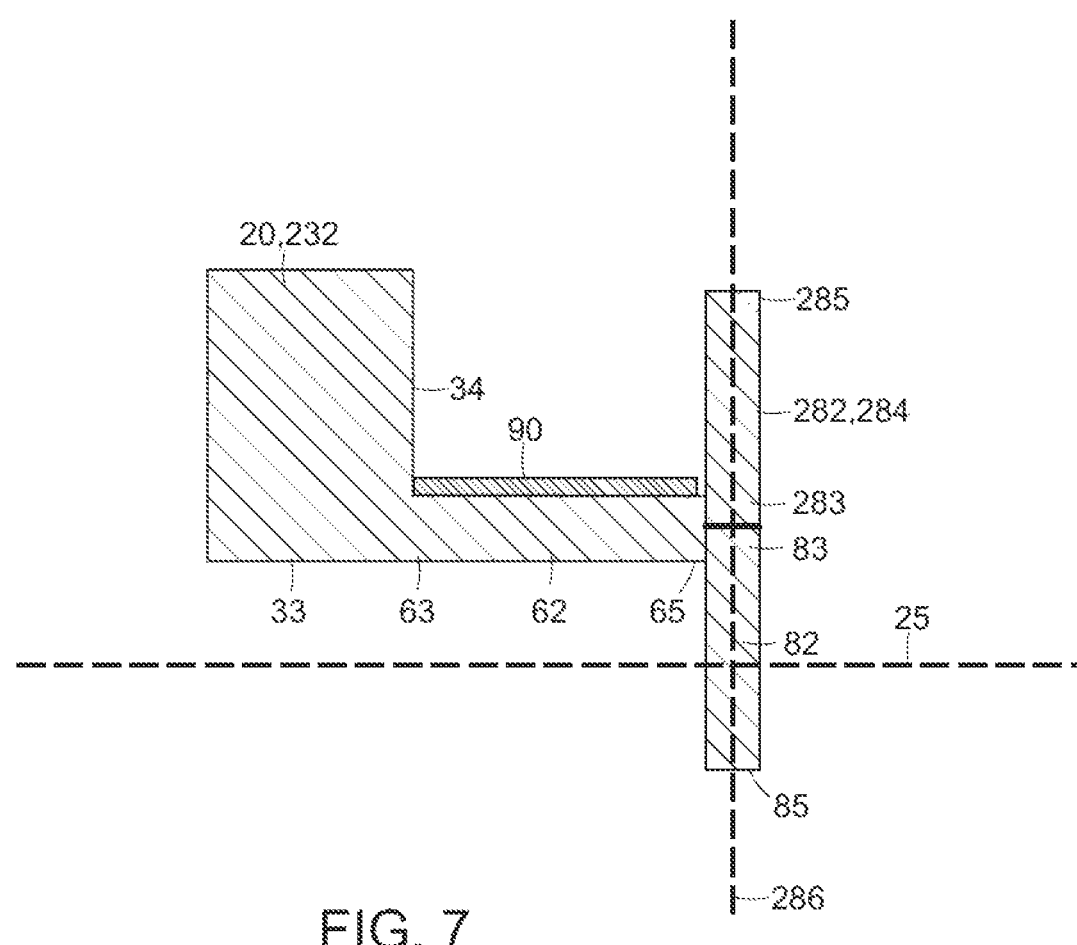
FIG. 7 is a side cross-sectional view of a portion of the MEMS device of FIG. 8 illustrating a single, alternative embodiment fluid interaction element.
Figure 8:
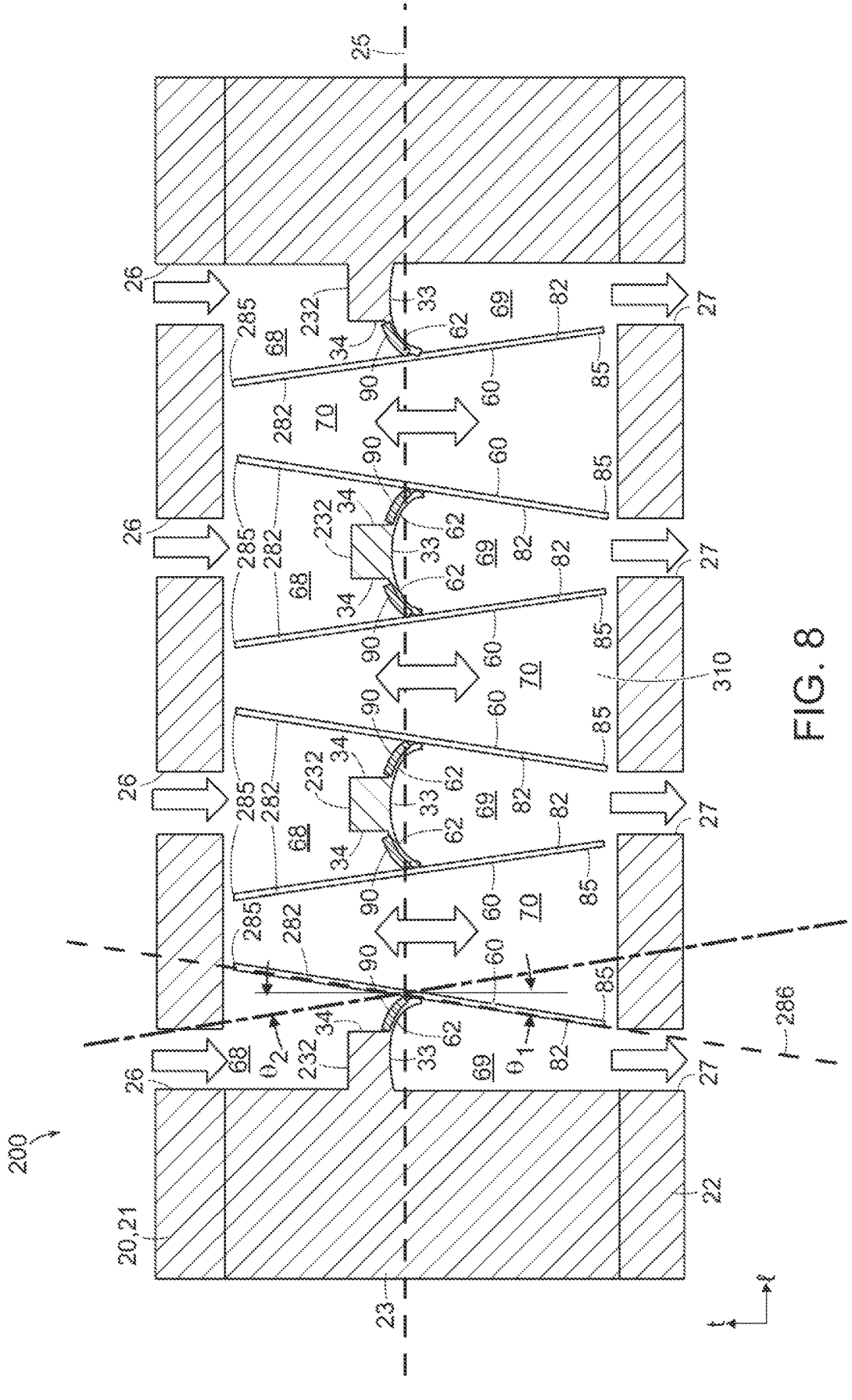
FIG. 8 is a side cross-sectional view of another alternative embodiment MEMS device.

Advantageously, the MEMS device 100 in which each FIE 60 is disposed within its own cavity allows better independent drive of the cantilever elements 62, 82, Referring to FIGS. 7 and 8, another alternative embodiment MEMS device 200 is similar to the MEMS device 10 described above with respect to FIGS. 4 and 5, and common reference numbers are used to refer to common elements. The MEMS device 200 shown in FIGS. 7 and 8 differs from the MEMS device 10 described above with respect to FIGS. 4 and 5 in that the support rails 232 do not protrude inward from an inner surface of the first layer 21. In the MEMS device 200, the support rails 232 extend through the interior cavity at a location that is spaced apart from both the first layer 21 and the second layer 22 of the substrate 20. For example, as illustrated, the support rails 232 are disposed generally mid-way between the first and second layers 21, 22, and are supported at each of opposed ends (e.g., in front of and behind the plane of the view shown in FIG. 8). A first cantilever arm 62 of a respective FIE 60 is supported on the support surfaces 34 of each support rail 232.

The MEMS device 200 shown in FIGS. 7 and 8 further differs from the MEMS device 10 described above with respect to FIGS. 4 and 5 in that each FIE 60 includes a third cantilever element 282. The third cantilever element 282 is a beam that protrudes from the second end 65 of the first cantilever element 62.

The third cantilever element 282 includes a third cantilever first end 283 that is fixed to the second end 65 of the first cantilever element 62 and a third cantilever second end 285 that is opposite the third cantilever first end 283. The third cantilever element 282 includes a third cantilever body 284 that extends between the third cantilever first and second ends 283, 285. The third cantilever body 284 and second end 285 are unsupported. When the FIE 60 is not actuated and/or is in an unloaded state (shown in FIG. 7), the third cantilever body 284 extends perpendicular to the substrate plane 25.

The third cantilever element 282 protrudes from the second end 65 of the first cantilever element 62 in a direction opposite to that of the second cantilever element 82 such that the first, second and third cantilever elements 62, 82, 282 are arranged in a T-shaped configuration. More specifically, the second cantilever first end 83 and the third cantilever element first end 283 are joined to each other such that the second cantilever first end 83, the second cantilever second end 85, the third cantilever first end 283 and the third cantilever second end 285 are aligned along a common axis 286, and the common axis 286 is perpendicular to the first cantilever element 62 when the FIE 60 is not actuated and/or is in an unloaded state.

In the MEMS device 200, the FIEs 60 are supported in a mirrored arrangement, and a first fluid port 26 and a second fluid ports 27 are each aligned with each respective support rail 232. By this configuration, an inlet space 68 is disposed between each first fluid port 26, the corresponding support rail 232 and the corresponding third cantilever element 282, and an outlet space 69 is disposed between each second fluid port 27, the corresponding support rail 232 and the corresponding second cantilever element 82.

When the first cantilever element 62 of each FIE is actuated so as to bend in a first direction, the second and third cantilever elements 82, 282 are moved from a first orientation (corresponding to an unloaded state of the FIE 60 and shown in FIG. 7) in which the common axis 286 is perpendicular to the substrate plane 25 to a second orientation in which the common axis is at a first angle θ1 relative to the substrate plane 25 (shown in FIG. 8). In the second orientation, for example, the second cantilever second end 85 is moved toward the corresponding support rail 232 relative to the first orientation and the third cantilever second end 285 is moved away from the corresponding support rail 232 relative to the first orientation. In this configuration, the inlet space 68 expands in volume and fluid is drawn into the interior cavity 30 via the respective first fluid port 26. At the same time, the outlet space 69 contracts in volume and fluid is discharged from the respective second fluid port 27. The intermediate spaces 70 that are disposed between adjacent FIEs 60 each maintains a substantially constant volume but changes shape to accommodate motion of the respective cantilever elements 62, 82, 282.

When the first cantilever element 62 of each FIE is actuated so as to bend in a second direction that is opposite the first direction, the second and third cantilever elements 82, 282 are moved from the second orientation in which the common axis 286 is at the first angle θ1 relative to the substrate plane 25 to a third orientation in which the common axis 286 is at a second angle θ2 relative to the substrate plane 25. In some embodiments, the second angle 82 is approximately equal to and opposite in direction to the first angle θ1 (e.g., θ2=−θ1). In FIG. 8, the third orientation is represented by a dot-dash line. In the third orientation, for example, the second cantilever second end 85 is moved away from the corresponding support rail 232 relative to the first orientation and the third cantilever second end 285 is toward the corresponding support rail 232 relative to the first orientation. In this configuration, the inlet space 68 contracts in volume and fluid is discharged from the interior cavity 30 via the respective first fluid port 26. At the same time, the outlet space 69 expands in volume and fluid is drawn into the respective second fluid port 27. The intermediate spaces 70 that are disposed between adjacent FIEs 60 each maintains a substantially constant volume but changes shape to accommodate motion of the respective cantilever elements 62, 82, 282.

Figure 9:
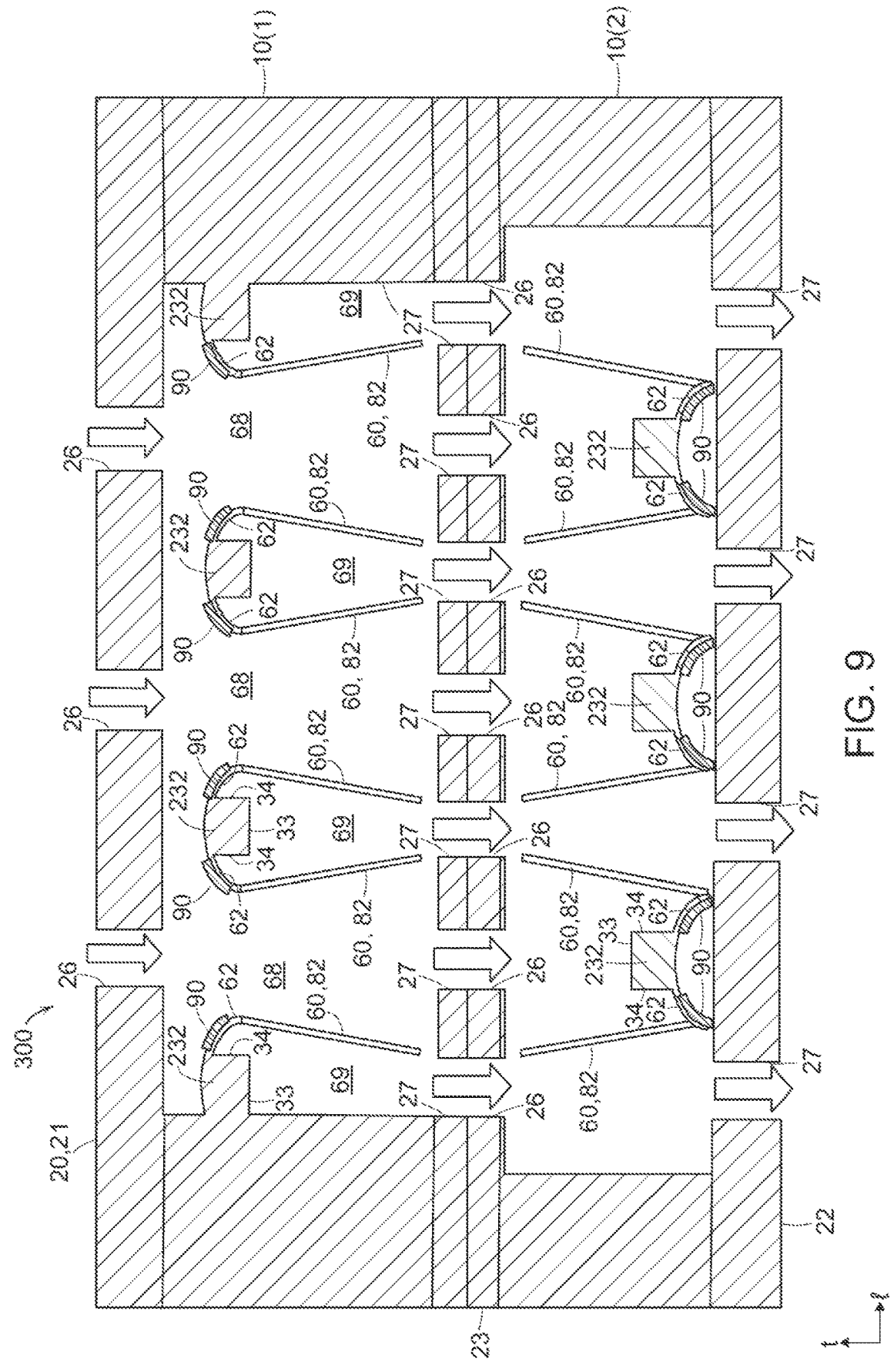
FIG. 9 is a side cross-sectional view of another alternative embodiment MEMS device.

Referring to FIG. 9, another alternative embodiment MEMS device 300 is similar to the MEMS device 10 described above with respect to FIGS. 4 and 5, and common reference numbers are used to refer to common elements. The MEMS device 300 shown in FIG. 9 differs from the MEMS device 10 described above with respect to FIGS. 4 and 5 in that the support rails 232 do not protrude inward from an inner surface of the first layer 21. In the MEMS device 300, the support rails 232 extend through the interior cavity 30 at a location that is spaced apart from both the first layer 21 and the second layer 22 of the substrate 20. A first cantilever arm 62 of a respective FIE 60 is supported on the support surfaces 34 of each support rail 232.

The MEMS device 300 shown in FIG. 9 further differs from the MEMS device 10 described above with respect to FIGS. 4 and 5 in that it provides a layered/stacked and cascaded arrangement of MEMS devices 10, in which the second fluid ports 27 of one layer (e.g., a first MEMs device 10) serve as the first fluid ports 26 of an adjacent layer (e.g., a second MEMS device 10). In addition, the support rails 232 of one layer, for example a first layer 10(1) are laterally offset (e.g., offset in a direction that is parallel to the substrate plane 25) with respect to the support rails 232 of the adjacent layer, for example a second layer 10(2). By this configuration, the operation phase of the two layers 10(1), 10(2) are shifted by 180 degrees.

This configuration effectively increases "the membrane area" (e.g., the surface area available to act on fluid or to be acted on by fluid) of the device 300 without increasing the size of the FIE 60 or the respective cantilevers 62, 82. This is advantageous because cantilever size may determine a vertical or thickness dimension of the device, which in turn is determined by limits of the manufacturing process. Thus, size limits imposed by manufacturing limitations can be circumvented by the stacked, serial arrangement of multiple MEMS devices illustrated in FIG. 9.

Figure 10:
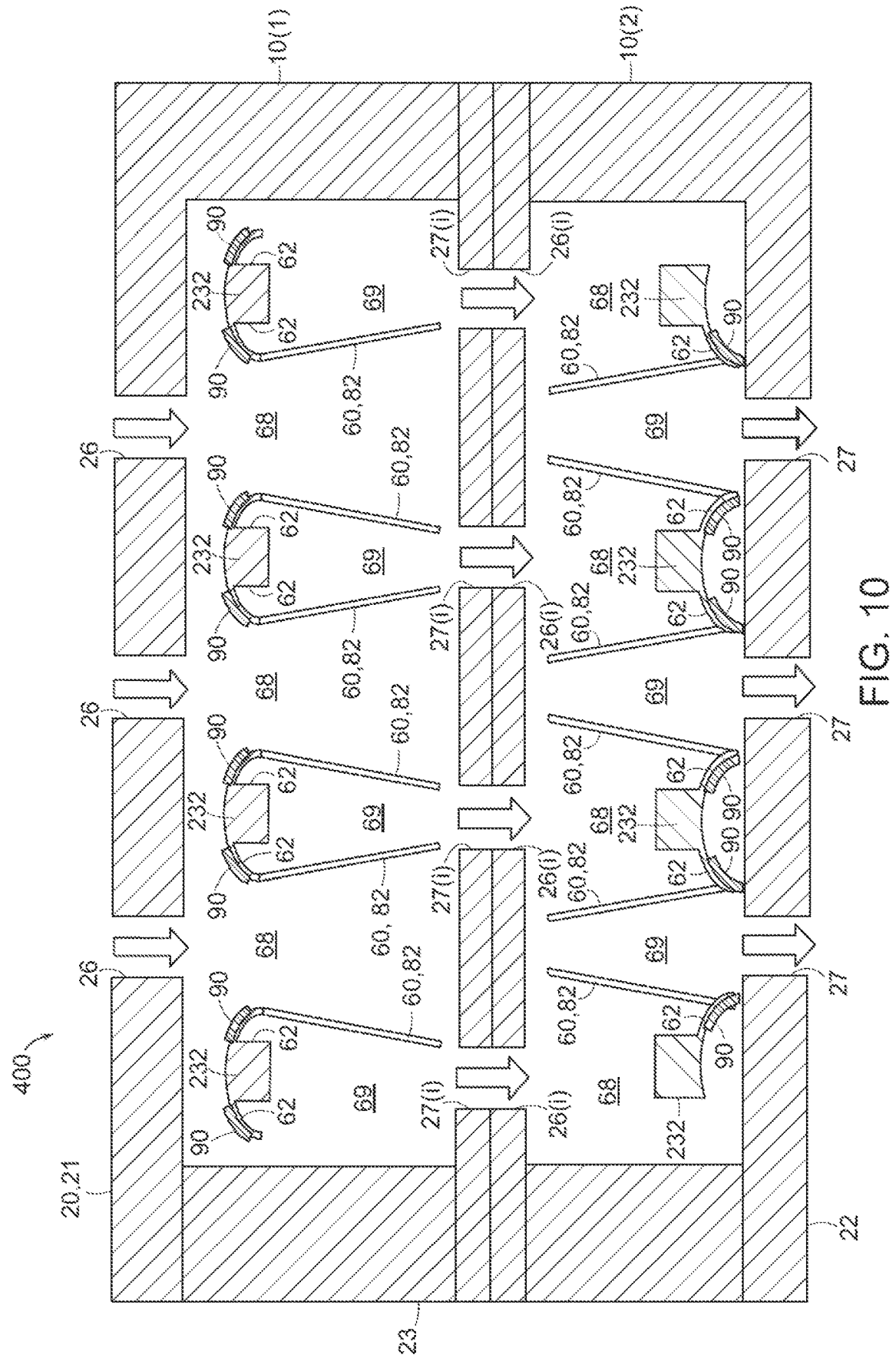
FIG. 10 is a side cross-sectional view of another alternative embodiment MEMS device.

Referring to FIG. 10, another alternative embodiment MEMS device 400 is similar to the MEMS device 300 described above with respect to FIG. 9, and common reference numbers are used to refer to common elements. The MEMS device 400 shown in FIG. 10 differs from the MEMS device 300 described above with respect to FIG. 9 in that the support rails 232 of one layer, for example a first layer 10(1) are vertically aligned (e.g., aligned in a direction that is perpendicular to the substrate plane 25) with respect to the support rails 232 of the adjacent layer, for example a second layer 10(2). By this configuration, the operation phase of the two layers 10(1), 10(2) are shifted by 180 degrees. In addition, the same fluid volume moves back and forth between the outlet space 69 of the first layer 10(1) and the inlet space 68 of the second layer 10(2) at locations where the interior fluid ports 26(*i*). 27(*i*), which in this embodiment are vertically aligned with the support rails 232, extend between the layers 10(1), 10(2).

Figure 11:
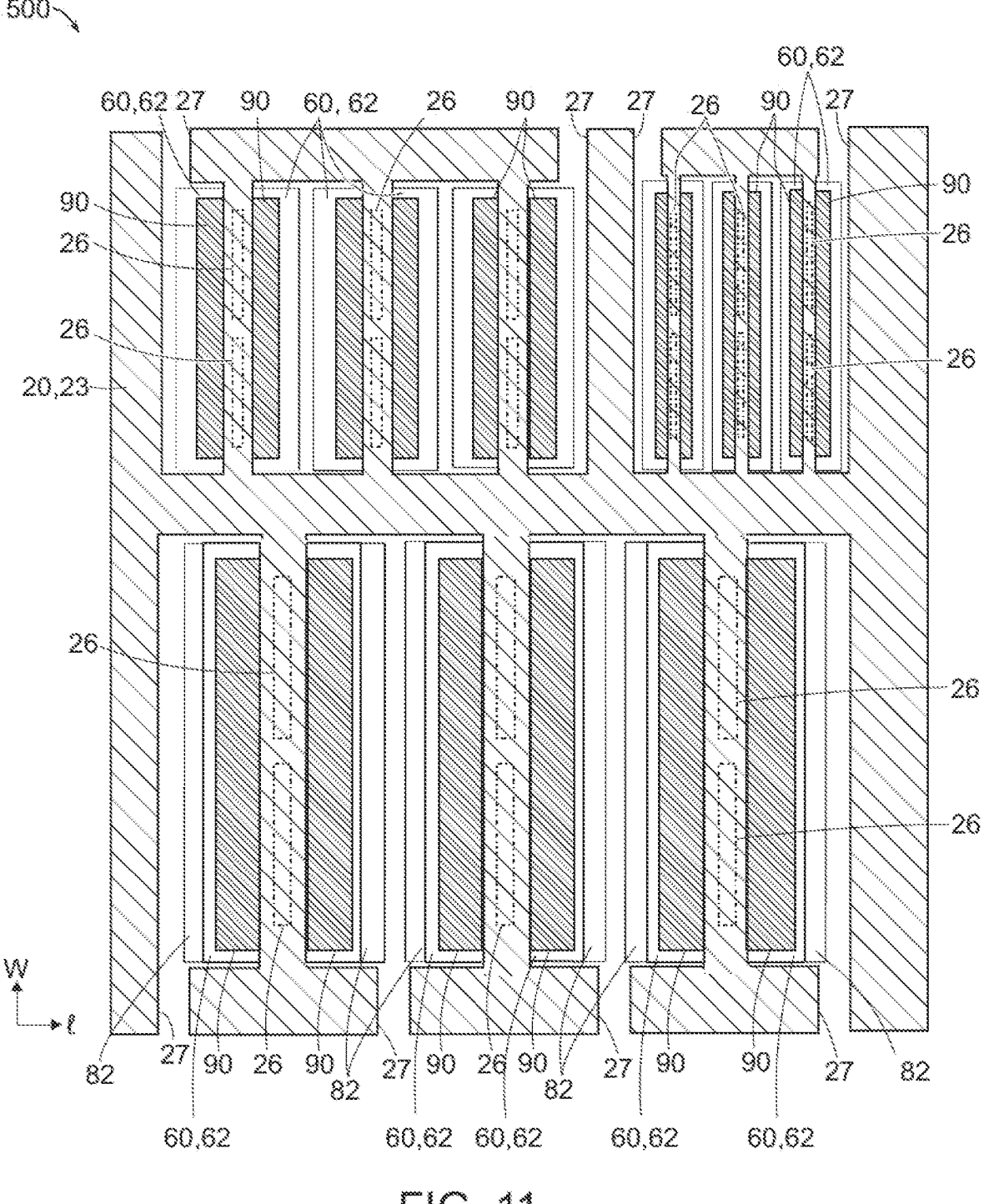
FIG. 11 is a top cross-sectional view of another alternative embodiment MEMS device.

Referring to FIG. 11, another alternative embodiment MEMS device 500 is similar to the MEMS device 10 described above with respect to FIGS. 4 and 5, and common reference numbers are used to refer to common elements. The MEMS device 500 shown in FIG. 11 differs from the MEMS device 10 described above with respect to FIGS. 4 and 5 in that the MEMS device 500 includes several arrays 501, 502, 503 of FIEs 60, where the FIEs 60 of a given array may have a different size than the other arrays of the MEMS device 500. In the illustrated embodiment, each array 501, 502, 503 has FIEs 60 of a unique size. By combining arrays 501, 502, 503 of different sizes, the MEMS device 500, when configured as a microspeaker, is able to produce different sound frequencies, for example, low, medium, and high frequency ranges. Alternatively, in the cases where the MEMS device 500 is configured as a sensor, the MEMS device 500 may be optimized for different frequencies or sound pressure levels (SPLs).

The MEMS device 500 shown in FIG. 11 further differs from the MEMS device 10 described above with respect to FIGS. 4 and 5 in that the second fluid ports 27 are provided in a sidewall of the substrate 20 whereby fluid may move into and out of the substrate 20 in a direction parallel to the substrate plane 25.

Figure 12:
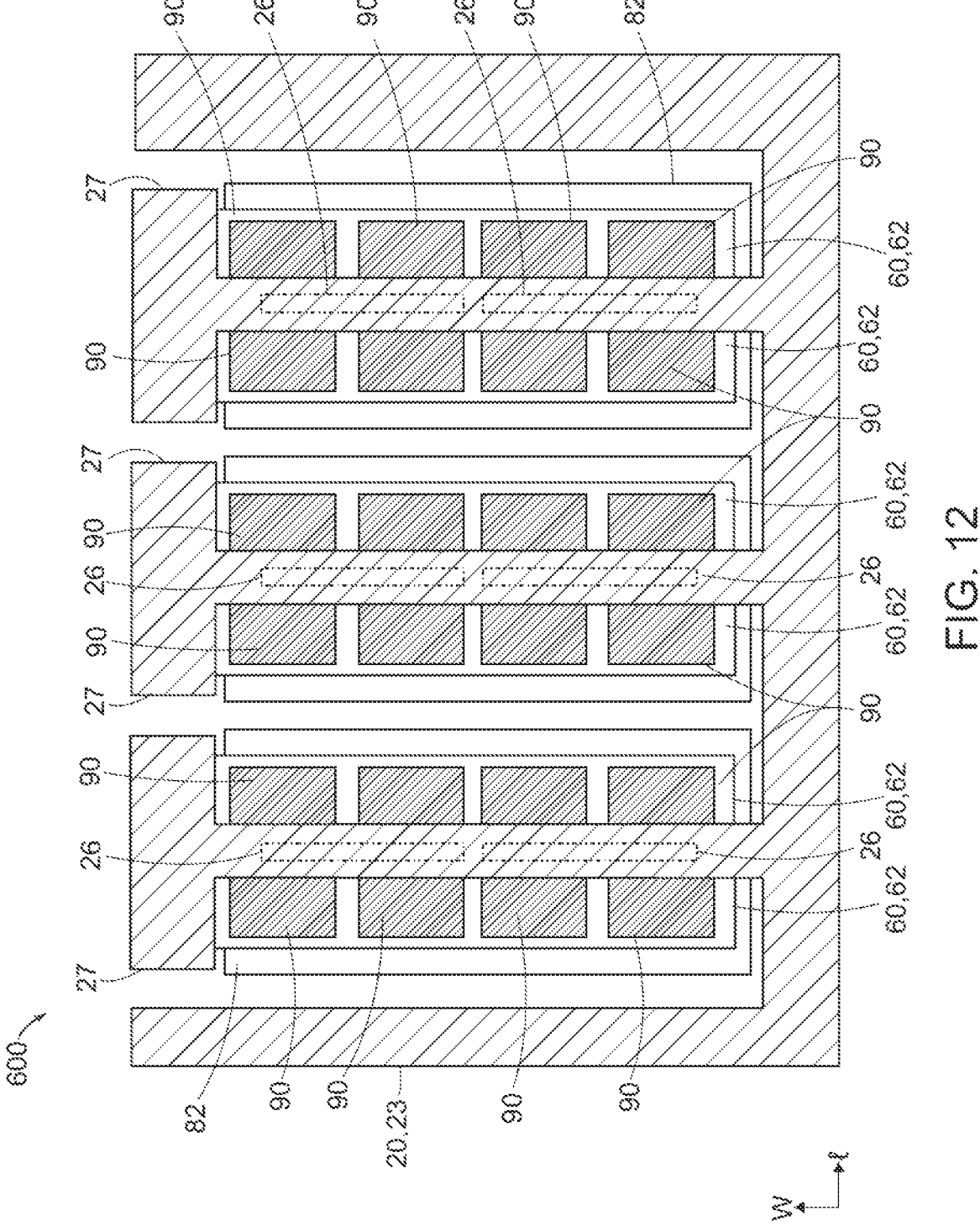
FIG. 12 is a top cross-sectional view of another alternative embodiment MEMS device.

Referring to FIG. 12, another alternative embodiment MEMS device 600 is similar to the MEMS device 10 described above with respect to FIGS. 4 and 5, and common reference numbers are used to refer to common elements. The MEMS device 600 shown in FIG. 12 differs from the MEMS device 10 described above with respect to FIGS. 4 and 5 in that the array of FIEs 60 includes segmented, individually addressable actuators 90 distributed along the width direction. In other words, rather than employing a single actuator along the width direction of the FIE 60, multiple, individual actuators 90 are used. In some embodiments, each actuator 90 can be individually actuated. In other embodiments, the actuators 90 may be ganged in pairs or other multiples, and the gangs may be individually actuated. Using segmented, individually addressable, or gang-addressable actuators 90 permits the FIEs 60 to perform non-uniform wave-like action, or to perform wave propagation, in a direction parallel to the substrate plane 25.

The MEMS device 600 shown in FIG. 12 further differs from the MEMS device 10 described above with respect to FIGS. 4 and 5 in that the second fluid ports 27 are provided in a sidewall of the substrate 20 whereby fluid may move into and out of the substrate 20 in a direction parallel to the substrate plane 25.

In the illustrated embodiments, the first and/or second cantilever elements 62, 82, 282 may exhibit reinforcement sections where an elongation is locally increased. In addition, or alternatively, to prevent excessive distortion of the cantilever elements 62, 82, 282, reinforcements consisting of locally wider sections can be provided where necessary.

In the illustrated embodiment, several FIEs 60 are connected to the substrate 20 by a common support rail 32, 232. Two or more FIEs 60 can share their support rail 32, 232 in an area-efficient way. For example, in some embodiments a FIE 60 is connected to opposed support surfaces 34 of a given support rail 32, 232 and/or may be arranged in the mirrored configuration described above. Although only a single FIE 60 is disclosed as being connected to a given support surface 34 of the support rails 32, 232, the MEMS devices are not limited to this configuration. For example, in some embodiments, several FIEs 60 may be connected to a given support surface 34 of the support rails 32, 232.

Although in the illustrated embodiments, each FIE 60 is actuated by one or more dedicated actuators 90, the FIEs 60 are not limited to this configuration. For example, the FIEs 60 in an array may be coupled to each other by a mechanical coupling means to ensure uniform movement of all cantilevers in the array. This prevents the FIEs 60 from moving all with slightly different phases. The FIEs 60 in a given array may exhibit different geometries (length, width, depth) of their respective first, second and or third cantilever elements 62, 82, 282. Thus, arrays can be tailored for individual frequency ranges.

Moreover, the arrays of FIEs 60 may be arranged in several layers forming a stacked system where the layers can be stacked either in a concordant or a mirrored way and input/output spaces of the layers are fluidically connected. This is to allow for scaling of the fluidic performance. Various fluidic connections and drive schemes are conceivable. Simultaneous actuation of multiple FIEs 60 in an array can enhance the fluidic performance. Several individually addressable arrays can be formed within a MEMs device. By doing so, the arrays can be switched on or off individually, providing a larger dynamic range than a single array and at the same time being energy efficient.

In the illustrated embodiments, the first fluid ports 26 and the second fluid ports 27 are located on opposite sides of the substrate 20. However, the fluid ports 26, 27 are not limited to this configuration. For example, the first fluid ports 26 and the second fluid ports may alternatively be disposed on two sides of the substrate 20 that are perpendicular to each other. This arrangement enables fluidic separation of the input and output fluid reservoir in a package.

Although the surfaces of the interior cavity 30 are illustrated herein as being planar, the surfaces of the interior cavity are not limited to being planar. For example, in some embodiments, the surfaces that are opposite a tip of a FIE 60 (e.g., opposite the second end 85, 285 of the second cantilever element 82, 282) may be shaped such that the spacing between the second end 85, 285 and the opposed surface is constant for every position of the second end 85, 285. In other words, the opposed surface may have an arc shape that matches the movement of the second end 85, 285, and a surface that faces an array of FIEs 60 may have a scalloped configuration when seen in cross-section.

Figure 13:
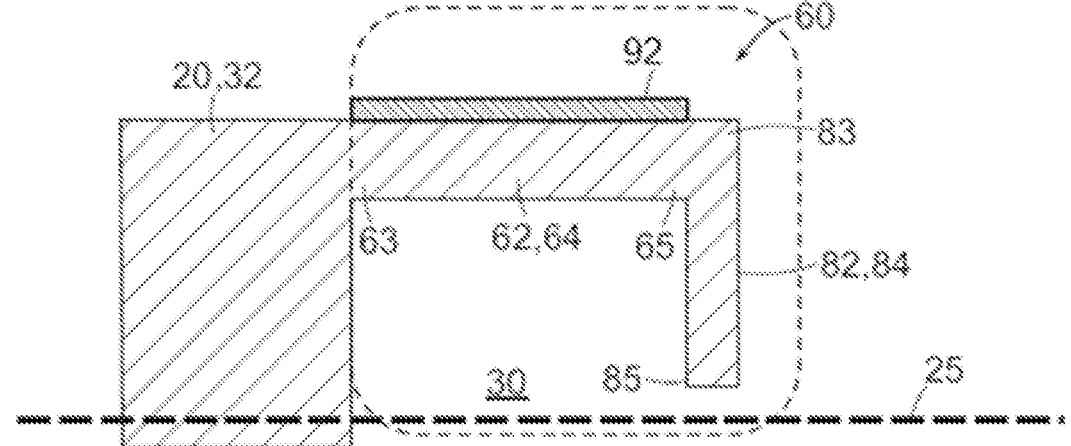
FIG. 13 is a side cross-sectional view of a portion of a sensing MEMS device.
Figure 14:
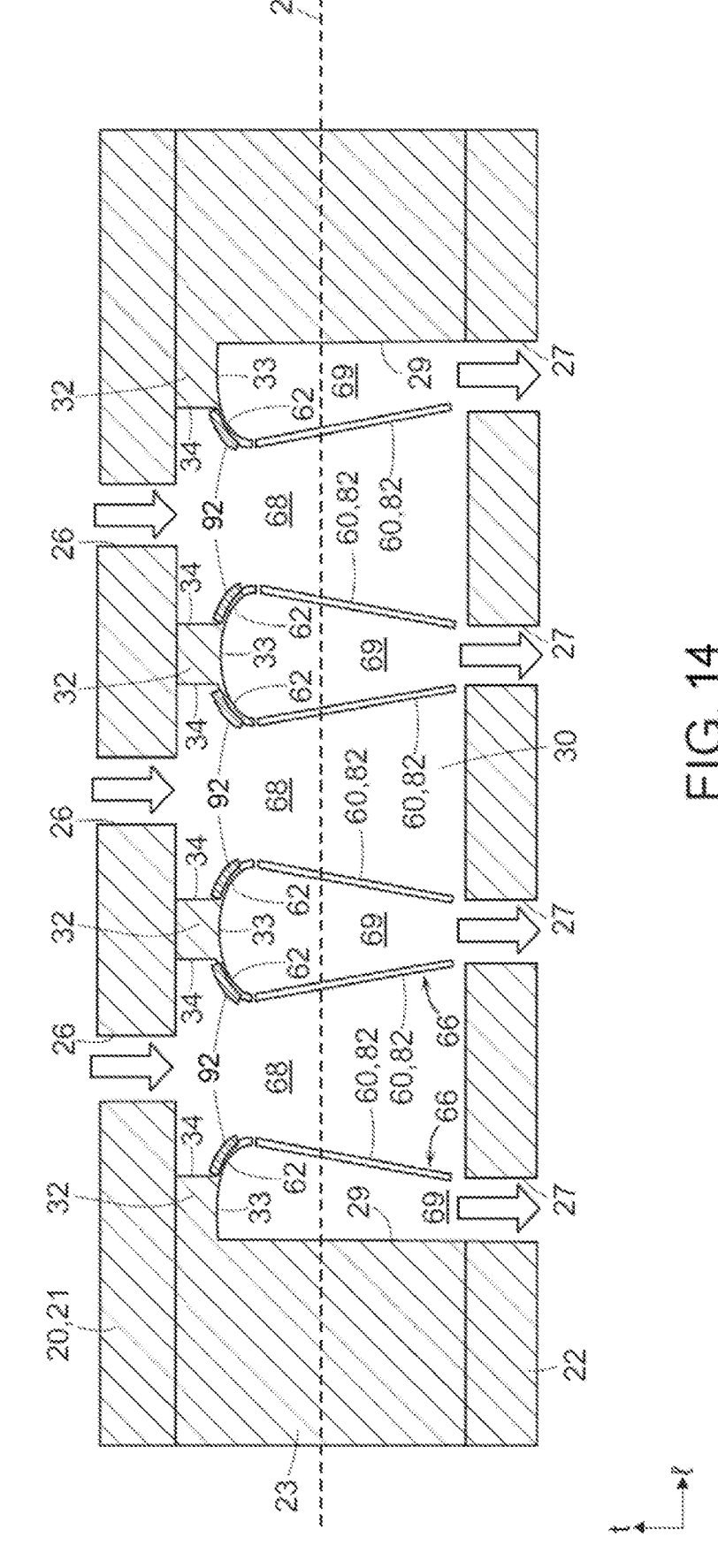
FIG. 14 is a side cross-sectional view of a sensing MEMS device illustrating several fluid interaction elements disposed in the interior cavity of the substrate.

Although exemplary embodiments of an actuated MEMS device 10 have been described herein for purposes of description, the MEMS device 10 is not limited to being an actuated MEMS device. For example, the MEMS device 10 may be a sensing MEMS device 700. Referring to FIGS. 13 and 14, an exemplary sensing MEMS device 700 is similar to the actuating MEMS device 10 described above, and common reference numbers are used to refer to common elements. The sensing MEMS device 700 differs from the actuating MEMS device 10 in that the actuators 90 are replaced by sensors 92 that are configured to detect motion of the FIEs 60. As a result, the FIEs 60 of the sensing MEMS device 700 are configured to permit detection of, for example, fluid flow rates through the MEMS device 700. In some embodiments, the sensing MEMS device 700 may be configured to sense a change of the ratio of input and output space volume. The fluid volume flow is driven by an external pressure difference between the first fluid ports 26 and the second fluid ports 27.

In the exemplary MEMS device 700 shown in FIG. 14, several FIEs 60 are disposed in a common interior cavity 30. In this embodiment, the FIEs 60 have a mirrored arrangement. When unloaded, each support rail 32 and the respective FIE(s) 60 supported thereon extend from the first layer 21 to a location closely spaced relative to the second layer 22 and thus generally extend in a direction perpendicular to the substrate plane 25. As a result, each FIE 60 (e.g., the first cantilever element 62 and the second cantilever element 82) and the corresponding support rail 32 cooperate to serve as a movable partition 66. Thus, the FIEs 60 are configured so that the support rails 32 and the first and second cantilever elements 62, 82 substantially divide the interior cavity 30 into separate spaces that include one or more inlet spaces 68 and one or more outlet spaces 69. In the illustrated embodiment, the inlet space 68 defines an inlet space volume. The inlet space 68 is proximate one or more of the first fluid ports 26 and communicates with at least one of the first fluid ports 26. The outlet space 69 defines an outlet space volume. The outlet space 69 is proximate one or more of the second fluid ports 27 and communicates with at least one of the second fluid ports 27.

The MEMS device 10 includes sensors 92 that are configured to detect movement of and/or strain in the first cantilever element 62 of each respective FIE 60. The sensors 92 may be strain detectors such as strain gauges or other appropriate sensing devices for nano-scale structures. In some embodiments, the strain state or motion of each FIE 60 is sensed individually by a single, dedicated sensor 92, while in other embodiments a single sensor 92 may monitor multiple FIEs 60. In still other embodiments, multiple sensors 92 may be used to monitor different locations of a single FIE 60 (e.g., segmentation). Segmentation and individual monitoring in the width direction enables better detection resolution.

Upon actuation by an applied fluid flow, the first cantilever element 62 and/or second cantilever element 82 is changed in shape and or dimension. In the illustrated embodiment, the first cantilever element 62 is bent about an axis parallel to the width direction upon actuation but is not limited to this motion. Although the second cantilever element 82 is not shown as deflected by the flow of fluid, the first cantilever element 62 may also be moved relative to the support rail 32 by virtue of the movement of the second cantilever element 82. In some embodiments, the second cantilever element 82 may be deflected by the fluid flow, depending on the properties of the material used to form the FIE 60. For example, the second cantilever element 82 may move in a waving or wiping motion.

The output from the sensor 92 may be received by the controller which may use the information to calculate, for example, a change of the ratio of input space volume to output space volume. In this example, the fluid volume flow may be driven by an external pressure difference between the first fluid ports 26 (inlet ports) and the second fluid ports 27 (outlet ports).

Selective illustrative embodiments of the MEMS device and FIEs are described above in some detail. It should be understood that only structures considered necessary for clarifying the MEMS device and FIEs have been described herein. Other conventional structures, and those of ancillary and auxiliary components of, the MEMS device and FIEs are assumed to be known and understood by those skilled in the art. Moreover, while working examples of the MEMS device and FIEs have been described above, the MEMS device and FIEs are not limited to the working examples described above, but various design alterations may be carried out without departing from the MEMS device and FIEs as set forth in the claims.

We claim:

1. A micro electromechanical system (MEMS) device, comprising:
   a substrate, the substrate including
   a first layer including a first fluid port,
   a second layer including a second fluid port, and
   an intermediate layer that is disposed between the first layer and the second layer in a stacked arrangement, the intermediate layer including a central opening, the central opening being in communication with the first fluid port and the second fluid port:
   a support rail that protrudes from an inner surface of the substrate so as to extend into the central opening, the support rail including a support surface;
   a fluid interaction element (FIE) that is disposed in the central opening, the FIE including
   a first cantilever element that protrudes from the support surface, the first cantilever element having a first cantilever first end that is fixed to the support surface and a first cantilever second end that is opposite the first cantilever first end and is unsupported,
   a second cantilever element having a second cantilever first end that is fixed to the first cantilever second end and a second cantilever second end that is opposite the second cantilever first end, the second cantilever second end being unsupported; and an actuator that is connected to the FIE and is configured to actuate FIE to move relative to the support rail.

2. The MEMS device of claim 1, wherein the support surface is perpendicular to the first layer.

3. The MEMS device of claim 1, wherein the support rail protrudes from the first layer so as to extend into the central opening.

4. The MEMS device of claim 1, wherein the support rail protrudes from the intermediate layer so as to extend into the central opening.

5. The MEMS device of claim 1, wherein the first layer, the second layer and the intermediate layer each have a length, a width, and a thickness, the support rail defines a rail axis that extends in a direction parallel to the width, and actuation of the actuator causes the first cantilever element to bend about an axis that is parallel to the rail axis.

6. The MEMS device of claim 1, wherein the substrate includes a partition that extends in parallel to the first and second layers, the partition segregates the central opening into a first chamber and a second chamber, the partition includes a partition fluid port that permits fluid communication between the first chamber and the second chamber, the support rail comprises a first support rail that is disposed in the first chamber and a second support rail that is disposed in the second chamber, and the FIE comprises a first FIE that is disposed in the first chamber and is supported on the first support rail and a second FIE that is disposed in the second chamber and is supported on the second support rail.

7. The MEMS device of claim 1, wherein the substrate includes a partition that extends in parallel to the first and second layers, the partition segregates the central opening into a first chamber and a second chamber, the partition includes a partition first fluid port and a partition second fluid port, the partition first port and the partition second fluid port permitting fluid communication between the first chamber and the second chamber, the support rail comprises a first support rail and a second support rail that are disposed in the first chamber, and a third support rail and a fourth support rail that are disposed in the second chamber, and the FIE comprises a first FIE and a second FIE that are disposed in the first chamber, and third FIE and a fourth FIE that are disposed in the second chamber, the first FIE is supported on the first support rail, the second FIE is supported on the second support rail, the third FIE is supported in the third support rail, and the fourth FIE is supported on the fourth support rail.

8. The MEMS device of claim 7, wherein the first support rail and the third support rail are aligned with the partition first fluid port along a first axis that is perpendicular to the first layer, and the second support rail and the fourth support rail are aligned with the partition second fluid port along a second axis that is perpendicular to the first layer.

9. The MEMS device of claim 7, wherein the partition includes a partition third fluid port and a partition fourth fluid port, the third and fourth fluid ports permitting fluid communication between the first chamber and the second chamber, the partition first fluid port, the partition second fluid port, the partition third fluid port and the partition fourth fluid port are arranged sequentially along a first axis that is parallel to the first layer, the first support rail is aligned with the partition first fluid port along a second axis that is perpendicular to the first layer, the third support rail is aligned with the partition second fluid port along a third axis that is perpendicular to the first layer, the second support rail is aligned with the partition third fluid port along a fourth axis that is perpendicular to the first layer, and the fourth support rail is aligned with the partition fourth fluid port along a fifth axis that is perpendicular to the first layer.

10. The MEMS device of claim 1, wherein actuation of the actuator results in movement of the first cantilever element and the second cantilever element within a plane, and an actuation force applied by the actuator acts in a direction perpendicular to the plane.

11. The MEMS device of claim 1, wherein when the FIE is unloaded, the second cantilever element extends in a direction that is substantially perpendicular to the first cantilever element.

12. The MEMS device of claim 1, wherein the first layer, the second layer and the intermediate layer each have a length, a width, and a thickness, the first fluid port extends in a thickness direction of the first layer, and the second fluid port extends in a thickness direction of the second layer.

13. The MEMS device of claim 1, wherein the FIE includes a third cantilever element having a third cantilever first end that is fixed to the first cantilever second end and a third cantilever second end that is opposite the third cantilever first end, the third cantilever second end being unsupported, and the second cantilever first end and the third cantilever element first end are joined to each other such that the second cantilever first end, the second cantilever second end, the third cantilever first end and the third cantilever second end are aligned along a common axis.

14. The MEMS device of claim 1, wherein the actuator is connected to the first cantilever element and is configured to actuate the first cantilever element to move relative to the support rail.

15. A fluid interaction element (FE) of a micro electro-mechanical system (MEMS) device, the MEMs device comprising a substrate that has an internal cavity that receives the FIE, the FIE comprising:

a first cantilever element that is configured to be cantilevered from an internal surface of the substrate, the first cantilever element having a first cantilever first end and a first cantilever second end that is opposite the first cantilever first end, the first cantilever second end being unsupported, and a second cantilever element having a second cantilever first end and a second cantilever second end that is opposite the second cantilever first end, the second cantilever first end being fixed to the first cantilever at a location that is spaced apart from the first cantilever first end, and the second cantilever second end being unsupported.

16. The FIE of claim 15, comprising an actuator that is connected to the first cantilever element and is configured to drive the first cantilever element to move relative to the substrate.

17. The FIE of claim 16, wherein the actuator is a piezo actuator.

18. The FIE of claim 16, wherein the actuator is a nanoelectric drive actuator.

19. The FIE of claim 16, wherein actuation of the actuator results in movement of the first cantilever element and the second cantilever element within a plane, and an actuation force applied by the actuator acts in a direction perpendicular to the plane.

* * * * *